(12) United States Patent
Bash et al.

(10) Patent No.: US 7,240,500 B2
(45) Date of Patent: Jul. 10, 2007

(54) DYNAMIC FLUID SPRAYJET DELIVERY SYSTEM

(75) Inventors: Cullen E. Bash, San Francisco, CA (US); Chandrakant D. Patel, Fremont, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 281 days.

(21) Appl. No.: 10/664,256

(22) Filed: Sep. 17, 2003

(65) Prior Publication Data

US 2005/0056030 A1 Mar. 17, 2005

(51) Int. Cl.
*F28C 1/00* (2006.01)

(52) U.S. Cl. ........................ 62/121; 62/259.2

(58) Field of Classification Search ............... 62/259.2, 62/171, 64, 121; 165/104.33, 80.4, 80.2; 361/696
See application file for complete search history.

(56) References Cited

U.S. PATENT DOCUMENTS

| | | | |
|---|---|---|---|
| 2,643,282 A | 6/1953 | Greene | 174/15 |
| 2,849,523 A | 8/1958 | Narbut | 174/15 |
| 2,858,355 A | 10/1958 | Narbut | 174/15 |
| 2,875,263 A | 2/1959 | Narbut | 174/15 |
| 4,141,224 A | 2/1979 | Alger et al. | 62/514 R |
| 4,290,274 A | 9/1981 | Essex | 62/157 |
| 4,352,392 A | 10/1982 | Eastman | 165/104.25 |
| 4,490,728 A | 12/1984 | Vaught et al. | 346/1.1 |
| 4,500,895 A | 2/1985 | Buck et al. | 346/140 R |
| 4,553,702 A * | 11/1985 | Coffee et al. | 239/690 |
| 4,559,789 A | 12/1985 | Riek | 62/157 |
| 4,576,012 A | 3/1986 | Luzenberg | 62/157 |
| 4,683,481 A | 7/1987 | Johnson | 346/140 R |
| 4,685,308 A | 8/1987 | Welker et al. | 62/171 |

(Continued)

FOREIGN PATENT DOCUMENTS

EP   509844 A1   10/1992 ............ 165/104.33

(Continued)

OTHER PUBLICATIONS

Sehmbey, M.S., Pais, M.R. and Chow, L.C., "Effect of Surface Material Properties and Surface Characteristics in Evaporative Spray Cooling," The Journal of Thermophysics & Heat Transfer, Jul.-Sep. 1992, vol. 6, No. 3, pp. 505-511.

(Continued)

*Primary Examiner*—Melvin Jones
(74) *Attorney, Agent, or Firm*—Richard P. Lange

(57) ABSTRACT

An adaptable semiconductor chip cooling system having a readily openable enclosure defining a chamber configured to hold a printed circuit board carrying components to be cooled. Within the enclosure is a sprayer delivery system with a height-controllable sprayer for spraying hot components. The sprayer delivery system has an actuator configured to move the sprayer among positions for spraying different components. The actuator can be of the types used for ink-jet printers or X-Y plotters. Alternatively, the actuator can be a continuous ribbon loop, or a series of radially extending rails. The actuator and sprayer are controlled by a controller, which also controls a configuration system that configures the sprayer delivery system for use with different boards. The controller uses sensors that sense the temperature of the hot components.

58 Claims, 5 Drawing Sheets

U.S. PATENT DOCUMENTS

| | | | |
|---|---|---|---|
| 4,794,410 A | 12/1988 | Taub et al. ............. | 346/140 R |
| 4,805,828 A | 2/1989 | Witherell et al. | |
| 4,825,337 A | 4/1989 | Karpman ................... | 361/386 |
| 5,212,975 A | 5/1993 | Ginzburg ...................... | 72/43 |
| 5,220,804 A | 6/1993 | Tilton et al. ................... | 62/64 |
| 5,247,426 A | 9/1993 | Hamburgen et al. ........ | 361/705 |
| 5,278,584 A | 1/1994 | Keefe et al. ............ | 346/140 R |
| 5,393,348 A * | 2/1995 | Morris ....................... | 118/668 |
| 5,434,606 A | 7/1995 | Hindagolla et al. ........... | 347/45 |
| 5,473,506 A | 12/1995 | Kikinis ....................... | 361/688 |
| 5,640,302 A | 6/1997 | Kikinis ....................... | 361/687 |
| 5,658,387 A | 8/1997 | Reardon et al. ............ | 118/323 |
| 5,718,117 A | 2/1998 | McDunn et al. ................ | 62/64 |
| 5,724,824 A | 3/1998 | Parsons ....................... | 62/171 |
| 5,797,274 A | 8/1998 | Jackaman et al. ............ | 62/171 |
| 5,907,473 A | 5/1999 | Przilas et al. ............... | 361/699 |
| 5,924,198 A | 7/1999 | Swanson et al. ........... | 29/890.1 |
| 5,943,211 A | 8/1999 | Havey et al. ................ | 361/699 |
| 5,992,159 A | 11/1999 | Edwards et al. ................ | 62/64 |
| 6,108,201 A | 8/2000 | Tilton et al. ................ | 361/689 |
| 6,139,361 A | 10/2000 | Przilas et al. | |
| 6,182,742 B1 | 2/2001 | Takahashi et al. ..... | 165/104.33 |
| 6,205,023 B1 | 3/2001 | Moribe et al. .............. | 361/704 |
| 6,205,799 B1 | 3/2001 | Patel et al. ................... | 62/132 |
| 6,349,035 B1 | 2/2002 | Koenen ....................... | 361/719 |
| 6,390,106 B1 | 5/2002 | Lin | |
| 6,393,853 B1 | 5/2002 | Vukovic et al. ........... | 62/259.2 |
| 6,484,521 B2 * | 11/2002 | Patel et al. ................... | 62/171 |
| 6,595,014 B2 | 7/2003 | Malone et al. ................. | 62/171 |
| 6,604,370 B2 | 8/2003 | Bash et al. ................... | 62/171 |
| 6,612,120 B2 | 9/2003 | Patel et al. ................... | 62/171 |
| 2002/0158144 A1 | 10/2002 | Anderson et al. | |
| 2004/0083742 A1 | 5/2004 | Ruiz et al. | |

FOREIGN PATENT DOCUMENTS

| | | | |
|---|---|---|---|
| JP | 56-137086 | 10/1981 | ............ 165/104.33 |
| JP | 2000252669 | 9/2000 | |

OTHER PUBLICATIONS

Pais, Martin R., Chang, Ming J., Morgan, Michael J. and Chow, Louis C., Spray Cooling of a High Power Laser Diode, SAE Aerospace Atlanta Conference & Exposition, Dayton, Ohio, 1994, pp. 1-6.

Morgan, Michael J., Chang, Won S., Pais, Martin R. and Chow, Louis C., "Comparison of High Heat-Flux Cooling Applications," SPIE, 1992, vol. 1739, pp. 17-28.

Lee, Chin C., and Chien, David H., "Thermal and Package Design of High Power Laser Diodes," IEEE, 1993, Ninth IEEE Semi-Therm Symposium, pp. 75-80.

Sehmbey, Mainder S., Chow, Louis C., Pais, Martin R. and Mahefkey, Tom, "High Heat Flux Spray Cooling of Electronics," American Institute of Physics, Jan. 1995, pp. 903-909.

Mudawar, I. and Estes, K.A., "Optimizing and Predicting CHF in Spray Cooling of a Square Surface," Journal of Heat Transfer, Aug. 1996, vol. 118, pp. 672-679.

Denney, D. Lawrence, "High Heat Flux Cooling Via a Monodisperse Controllable Spray", A Thesis Presented to The Academic Faculty of Georgia Institute of Technology in Partial Fulfillment of the Requirements for the Degree Master of Science in Mechanical Engineering, Mar. 1996.

R. Hannemann, L. R. Fox and M. Mahalingham, "Thermal Design for Microelectronic Components," in "Advances in Cooling Techniques for Computers" 245-276 (Win Aung ed., Hemisphere Publishing Corporation, 1991).

"Advances in Cooling Techniques for Computers" 150-153 (Win Aung ed., Hemisphere Publishing Corporation, 1991).

Robert Darveaux and Iwona Turlik, "Backside Cooling of Flip Chip Devices in Multichip Modules," ICMCM Proc. 230-241 (1992).

Herman W. Chu, Christian L. Belady and Chandrakant D. Patel, "A Survey of High-performance, High Aspect Ratio, Air Cooled Heat Sinks," International Systems and Packaging Symposium (1999).

Chandrakant D. Patel, "Backside Cooling Solution for High Power Flip Chip Multi-Chip Modules," IEEE ECTC Proceedings 442-449 (May 1994).

* cited by examiner

DYNAMIC FLUID SPRAYJET DELIVERY SYSTEM

The present invention relates generally to cooling systems for heat-generating devices and, more particularly, to a dynamic cooling fluid delivery system and a method of dynamically delivering cooling fluid to cool one or more hot components.

BACKGROUND OF THE INVENTION

With the advent of semiconductor devices having increasingly large component densities, the removal of heat generated by these devices has become an increasingly challenging technical issue. Highly available computer systems, to prolong a customer's investment, are designed to both be maintained for long periods and to be easily maintained over time. This makes it preferable that a computer system is well cooled across all of its components on each board, and that the computer can quickly and readily accept replacements for malfunctioning boards. Typical processor boards sometimes include multiple CPU modules, application-specific integrated circuits, and one or more types of memory such as static random access memory, as well as dc-dc converters, all of which have different and extreme power dissipation requirements. Adding to the complexity, the variety of chip types on typical processor boards provides for chip surfaces at a variety of heights off the board's surface.

In the past, the low power dissipation of the processors accommodated the use of low cost, air-cooled heat sinks that require minimal re-design effort. However, with higher dissipation requirements comes more complex cooling systems that make both the even cooling requirements and the serviceability of a board a more complex issue. In particular, different components stand up off the board with different heights, which causes board-wide cooling systems to cool different components to different degrees, even if the components' power dissipation levels are similar, which typically is not the case.

Spray-cooling technologies can offer high dissipation levels that meet extreme cooling requirements. With reference to FIG. 1, in spray cooling, an inert spray coolant from a reservoir 11 is preferably sprayed by sprayers 13 onto chips 15 mounted on a printed circuit board 17. The coolant preferably evaporates, dissipating heat within the chip. The sprayers and chips, and the board, are mounted within sealed cases 19 fixed within a computer system. The sprayed coolant is typically gathered and cooled within a condenser 21, and then routed back to the reservoir by a pump 23.

The cases are evacuated systems with robust closure systems. Access to the components for maintenance can typically be had only through extensive disassembly of the computer system and case, which is significantly more time consuming and costly than the maintenance of standard air-cooled chips. Thus, for a liquid cooled board, board replacement becomes a complex issue that must deal with the presence of liquid, and potentially the need for an evacuated system.

Additionally, the repair or replacement of the cooling system, which includes a multitude of sprayers, can be time consuming and expensive. To minimize computer down time when a sprayer fails to function properly, a complete replacement of the cooling system can be used. However, the costs of such a replacement can be high because a number of functional sprayers that must be discarded with the dysfunctional sprayer.

Furthermore, it is known that the thermal performance achieved from spray cooling is dependant upon the distance between the firing nozzle and the hot surface. A greater distance allows for more of the cooling fluid to evaporate prior to reaching the chip. Furthermore, drag reduces the speed of the droplets, allowing even more cooling fluid to evaporate prior to reaching the chip. The evaporation of cooling fluid prior to reaching the chip reduces the fluid flow rate received by the chip, and thus reduces the thermal performance of the spray-cooling system. The reduced speed of the droplets also reduces their momentum, and thus their ability to penetrate vapor barriers, such as can form at near-maximum levels of heat flux for a spray-cooling system.

Since processor boards can and often do contain components of dissimilar heights, it has been suggested that the hottest component be used as the reference component to determine the sprayjet cartridge-to-board spacing. The primary disadvantage of this technique is that fluid may be delivered inefficiently to other hot components of markedly different heights from the reference component.

Accordingly, there has existed a need for an easily maintainable spray-cooling system that maximizes spray-cooling efficiency for a plurality of components on a printed circuit board, while minimizing system cost. Preferred embodiments of the present invention satisfy these and other needs, and provide further related advantages.

SUMMARY OF THE INVENTION

In various embodiments, the present invention solves some or all of the needs mentioned above by providing a cooling system that efficiently operates on one or possibly more high-dissipation devices.

The invention can typically be a delivery system for delivering cooling fluid to cool a hot component on a board. The component has a designated spray-location, which might vary depending on the sprayer to be used. The invention features a spray-module and an actuator. The spray-module includes a sprayer configured for delivering cooling fluid to cool the component when the spray-module is located in the designated spray-location. The actuator is configured to actuate through a plurality of actuator positions that (relatively) position the spray-module at a plurality of lateral locations with respect to the board. One of the plurality of lateral locations is the designated spray-location.

Optionally, the invention might be further configured for delivering cooling fluid to cool a second hot component on the board, the second component having a second designated spray-location. The second designated spray-location might be one of the first plurality of lateral locations. Alternatively, the invention might feature a second spray-module and a second actuator. The second spray-module includes a second sprayer configured for delivering cooling fluid to cool the second component when the second spray-module is located in the second designated spray-location. The second actuator is then configured to actuate through a second plurality of actuator positions that (relatively) position the second spray-module at a second plurality of lateral locations with respect to the board, one of the second plurality of lateral locations being the second designated spray-location;

Advantageously, such features might be adapted to allow for actuation of the spray-module from the designated spray-location to a lateral location that is safe for inserting and removing the board. Likewise, such features might be adapted to provide for the spray cooling of a multitude of components with only a limited number of actuators and sprayers, thus minimizing both the cost of the spray-modules and the number of spray-modules that might fail.

The invention can further feature a controller configured to control the delivery of cooling fluid by each sprayer, to cool the plurality of components. In doing so, the controller might control the operation of the actuator to control the delivery of cooling fluid by the sprayer (e.g., by controlling the cooling times), or the controller might control the operation of the spray-modules to control the delivery of cooling fluid by the sprayer (e.g., by controlling cooling fluid spray rates). The controller might also control a height-actuator configured to control the spraying height of the sprayers above the components, the use of a spray-module station to refill reservoirs in the spray-modules, and/or a configuration system configured to adapt embodiments of the invention for use with different pluralities of lateral locations, and thus for different designated spray-locations.

These additional features typically provide for spray cooling with a high degree of control over an efficient cooling process. The refillable reservoirs and configuration system typically allow for embodiments of the invention to accommodate a wide range of board layout variation.

The invention can further feature one or more sensors configured to sense cooling-status information. The controller is configured to control the delivery of cooling fluid by the sprayers to cool the components, based on the cooling-status information sensed by the sensors. Advantageously, this feature typically provides for the highly controlled cooling process to be quickly and accurately responsive to the changing cooling status of the components.

Other features and advantages of the invention will become apparent from the following detailed description of the preferred embodiments, taken with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather it is intended to provide particular examples of them.

Figure 1:
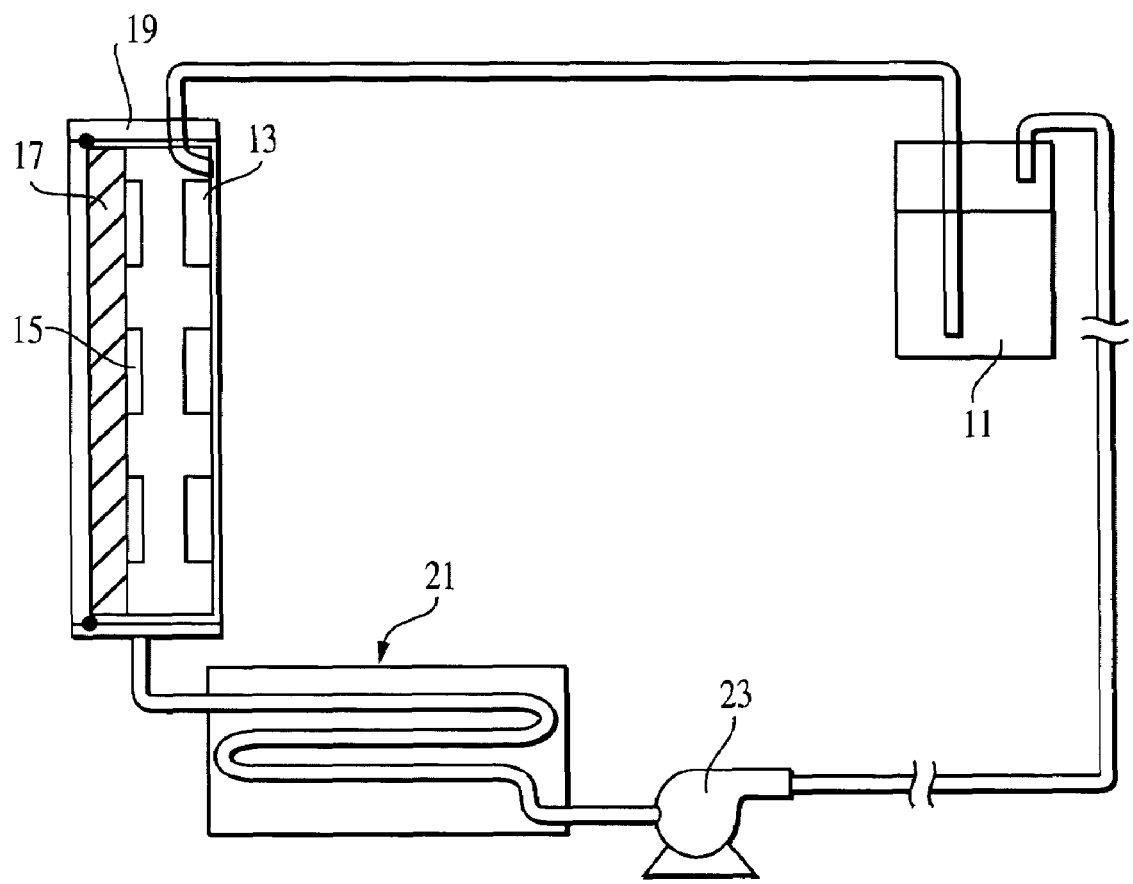
FIG. 1 is a system layout of a prior art spray-cooling system.
Figure 2:
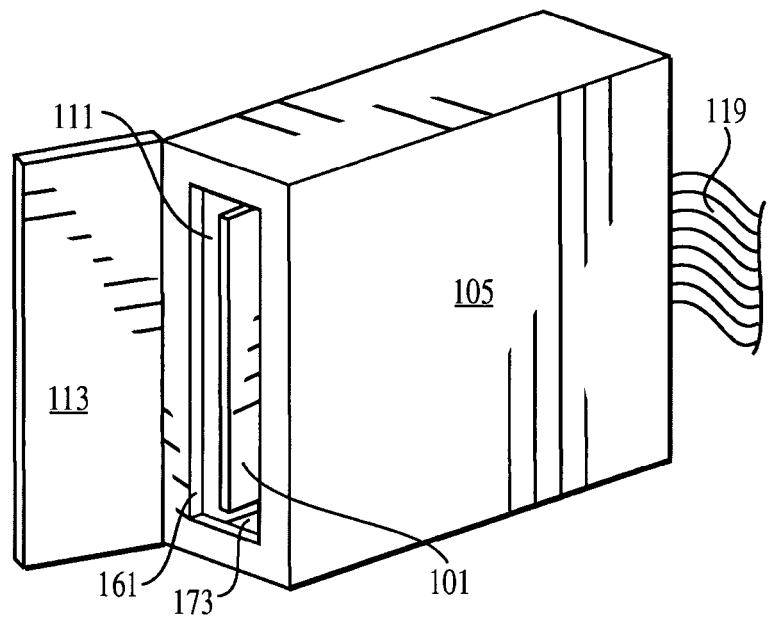
FIG. 2 is a perspective view of a first modular board connection system embodying the invention, and a printed circuit board.
Figure 3:
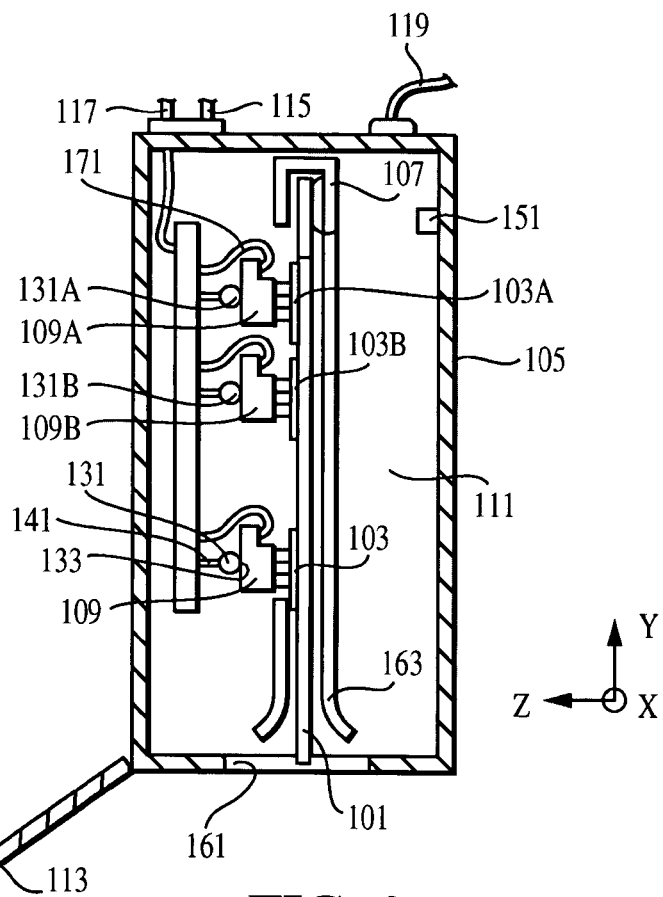
FIG. 3 is a top cross-sectional view of the first modular board connection system and the printed circuit board, as depicted in FIG. 2, the first modular board connection including a sprayer delivery system.
Figure 4:
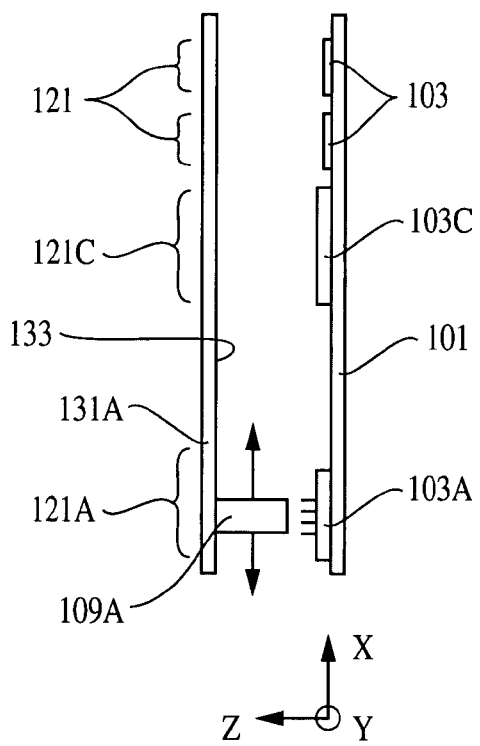
FIG. 4 is a front view of a first actuator and a first spray-module spraying a printed circuit board, the first actuator being part of the sprayer delivery system, as depicted in FIG. 2.

With reference to FIGS. 2 through 4, a first preferred embodiment of the invention resides in a sprayer delivery system, a related board connection system, a related spray-cooling system, and in related methods. One or more board connection systems of this embodiment can be installed as part of an electronic device (not shown), such as a computer system, to provide for the use of spray cooled printed circuit boards that can be quickly and easily serviced and replaced, or upgraded.

The board connection system is designed to removably contain a printed circuit board 101 carrying one or more heat-producing components 103 such as semiconductor chips, including a hot (and typically heat-producing) first component 103A, and preferably a hot (and typically heat-producing) second component 103B and a hot (and typically heat-producing) third component 103C. The board connection system includes apparatus for spray cooling the chips with a cooling fluid while the chips are hot and in operation. The electronic device is preferably configured for the efficient replacement of the board, potentially without shutting down. Thus, the invention allows for hot-pluggable replacement boards that are spray cooled.

More particularly, this embodiment of the board connection system includes an enclosure 105, an electrical connector 107, the sprayer delivery system, and a plurality of spray-modules 109 including a first spray-module 109A, a second spray-module 109B, and preferably one or more additional spray-modules, each spray-module having one or more sprayers. The enclosure defines an internal chamber 111, the chamber being configured to contain the board, the sprayer delivery system, and the spray-modules.

A door 113 of the chamber can be readily opened and closed, such as by hand, for external access to the chamber. This access allows printed circuit boards to be removed and replaced while the chamber is opened. When the chamber is closed, it is sealed such that cooling fluid cannot leak from the chamber, and can only enter or exit the chamber through an inlet port 115 and an outlet port 117. Preferably, the seal created by the door 113 is adequate to allow the chamber 111 to be evacuated. The electrical connector is configured to electrically connect the electronic device to the inserted printed circuit board via a ribbon cable 119, enabling the operation of the one or more chips.

The spray-modules 109 are located within the chamber 111, and each of their sprayers is preferably configured to spray cooling fluid toward one or more of the components 103 while the components are hot, such as during the components' operation. More particularly, the sprayer delivery system is configured for operating each spray-module in one or more lateral locations, some of which are preferably designated spray-locations 121 for spraying (relative to) hot components on the board. In preferred embodiments, each component's designated spray-location is an appropriate location or range of locations for a spray-module sprayer (of the type to be used) to spray cooling fluid at or onto the component so as to cool the component (e.g., a first designated spray-location 121A is appropriately used by the first spray-module 109A to spray cool the first component 103A). Therefore, for any given module, the spray-location might depend on the configuration of the spray-module. As a result, each spray-module sprayer is configured to spray cooling fluid such that, when the spray-module is located in the designated spray-location for a given component, the spraying sprayer delivers cooling fluid to cool that component.

The sprayer delivery system includes a plurality of actuators 131, including a first actuator 131A and a second actuator 131B. Each actuator is configured to actuate through a plurality of actuator positions. Each actuator's plurality of actuator positions relatively positions (with respect to the board) the spray-module 109, with one degree-of-freedom, at a respective plurality of lateral locations with respect to the board (i.e., each position of each actuator positions the spray-module at a respective lateral location). Each plurality of lateral locations can be a continuum of lateral locations, a plurality of discrete locations, or combinations of the two. The actuators are described as relatively moving the spray-module because in variations of the embodiment, the actuator could move the board/and/or components rather than the actuator.

More particularly, the first actuator 131A is structurally configured for one-degree-of-freedom actuation, i.e., it is configured to actuate the first spray-module 109A along a one-degree-of-freedom pathway and position it among a first plurality of lateral locations. Likewise, the second actuator 131B is structurally configured for one-degree-of-freedom actuation, i.e., it is configured to actuate the second spray-module 109B along a one-degree-of-freedom pathway and position it among a second plurality of lateral locations. Each actuator's plurality of actuator positions independently determines the lateral locations to which its spray-module can be actuated (i.e., no other actuator affects whether the spray-module laterally reaches the lateral locations). This monotonic advancement, along a single, one-degree-of-freedom pathway, can be provided with a single actuation motor (not shown) that actuates the spray-module along some form of an actuation track 133. This motor could be a servo mechanism of the type used in drop-on-demand printers.

In the context of this application, the concepts of "lateral locations" and "laterally located" should be understood to include locations in or near a parallel-plane, being a plane that is parallel to the plane of the board, or to a plane defined by the components. Locations can be considered near the parallel-plane when they are above or below the parallel-plane by an amount no greater than would be a reasonable, functional variation in spraying height (from the board). Such variation can be related to varying component heights, varying component cooling needs, actuator margins of error, and other such appropriate reasons for sprayer height variation. Nevertheless, it should be noted that in moving among its various positions, an actuator might move the spray-module to be more distant from the parallel-plane, or to a location that is not over the board. This can allow for the spray-module to pass over or under obstacles, or for the spray-module to be retracted from being an obstacle for various types of maintenance operations.

Included among the first plurality of lateral locations is the first designated spray-location 121A, which is a spray-location for the first component 103A. Likewise, included among the second plurality of lateral locations is a second designated spray-location, which is for the second component 103B. Thus, the sprayer of the first spray-module is configured for delivering cooling fluid to cool the first component when the first spray-module is positioned in the first designated spray-location, and the sprayer of the second spray-module is configured for delivering cooling fluid to cool the second component when the second spray-module is positioned in the second designated spray-location.

Given a printed circuit board with appropriately located components, each plurality of lateral locations can further include one or more additional designated spray-locations for spraying additional components. For example, for the depicted printed circuit board, the first plurality of lateral locations further includes a third designated spray-location 121C for spraying the third component 103C. More generally speaking, the actuator is preferably configured to be usable with a plurality of different printed circuit boards, each potentially having different numbers and locations of hot components along the one-degree-of-freedom groups of lateral locations.

Each of the actuators is configured such that its plurality of lateral locations lies along a line, e.g., the first plurality of lateral locations lies along a first actuator line, and the second plurality of lateral locations lies along a second actuator line. The actuator line of each actuator is parallel to the actuator lines of the other actuators, and thus the first and second actuator lines are parallel. Preferably, the lines are at the same height off the board, but optionally they can be at different heights within the range of spraying heights for lateral locations. In FIG. 3, these actuator lines are parallel to the x-axis, extending along the edges of the actuation track 133. This arrangement provides for parallel, linear zones of spray-cooling coverage on the printed circuit board. Preferably, the actuators thus provide for flexibly configured spray cooling that can adapt to component configurations on a large variety of different boards that might be inserted into the chamber.

A controller is used to control the delivery of cooling fluid to cool each component 103 by its appropriate spray-module sprayer (i.e., by the sprayer on the spray-module that can be positioned in the designated spray-location of that component). The controller can comprise hardware and/or software, and can be provided in the components on the printed circuit board 101, in components that are part of the spray-module 109 or the sprayer delivery system, or in components external to the sprayer delivery system and circuit board.

The controller may be configured to control the delivery of cooling fluid to cool each component 103 by directing the operation of the appropriate spray-module sprayer such that it sprays when its spray-module is located in the designated spray-location 121 for the component. Alternatively, or concurrently, the controller may be configured to control the delivery of cooling fluid to cool each component by controlling the operation of each actuator 131 to direct the timing of one of the spray-modules 109 at the appropriate designated spray-location (e.g., direct the time and/or the length of time in which the first actuator places the first spray-module at the first component designated spray-location). In a very simplistic variation of this embodiment, the controller could be configured to simply activate the actuator for oscillating motion and spraying when a certain criterion is met, such as the printed circuit board components are present and energized.

The controller preferably controls the operation of each actuator 131, directing it to move among the lateral locations that serve as designated spray-locations 121 for a given printed circuit board. Preferably, the controller includes (or operates with) a configuration system configured to adapt the sprayer delivery system for use with different pluralities of designated spray-locations on different types of boards. More particularly, the configuration system has a location-designator portion that identifies configuration information for a given printed circuit board. The configuration information preferably includes both location information and cooling requirement information for the components on the board. The location information identifies the designated spray-locations, either directly, or more preferably, by specifying locations (and possibly heights) of the components. The later of these options allows the controller to directly calculate designated spray-locations appropriate for the type of sprayer used in the spray cooling system. The cooling requirements might be static requirements, or they might include information identifying cooling needs for different component activity levels.

This configuration information might be read or derived from the printed circuit board 101, such as from data stored by components 103 on the printed circuit board or from board structure that indicates the information. Alternatively, the board might supply board identification information, and the configuration system might access the configuration information for the identified board type from another source, such as an available database. Additionally, the configuration information might come from another source such as user input. In variations of the invention having a plurality of components carried on a plurality of insertable boards, the configuration information can be retrieved from any of the boards, or from a combination of boards.

Using the layout information obtained by the configuration system, the controller can be adapted to direct the actuators 131 according the components' cooling needs. The component-location information is used to establish spray-module actuator control functions, such as identifying which lateral locations are designated spray-locations. More particularly, for spray-modules having only one designated spray-location among its plurality of lateral locations, the controller can direct the actuator to move that spray-module to the designated location and not move it away during cooling. For spray-modules having two or more designated spray-locations among their plurality of lateral locations, the controller can direct the actuator to move among the designated locations with movements based on general cooling requirements.

Preferably, the cooling requirements are used to establish cooling fluid delivery rates and/or frequencies. Optionally, the controller can monitor component activity levels and adjust cooling levels accordingly. Even without having variable cooling level requirements, preferably the controller selectively cools only components that are actively producing heat (i.e., it does not direct the cooling of components that are not energized and/or in use). When no components associated with a given spray-module are in use, the spray-module and its actuator can be shut down for energy efficiency.

Alternatively, or optionally, using the layout information obtained by the configuration system, the actuators can adjust their positions so as to provide a new set of available laterally located positions, and thus to be adapted for use according the components' cooling needs. The component-location information is used to establish how the actuators adapt, such as identifying how the actuators must be moved to align the lateral locations with the designated spray-locations.

The sprayer delivery system preferably includes a height-actuator 141 for each actuator, and more preferably for each spray-module 109, the height-actuator being configured to control the spraying height of the spray-module sprayer at the designated spray-location above each component 103 for which the spray-module is appropriately used. The height-actuator might operate by vertically (with respect to the printed circuit board) displacing the actuator that actuates the spray-module (as depicted in FIG. 3), it might operate by vertically displacing the spray-module with respect to the actuator. Or, it might operate by displacing the sprayer with respect to the remainder of the first spray-module. The height-actuator can be any of a variety of mechanical or electro-mechanical devices, and is preferably controlled by the controller in response to layout information. Optionally, a height sensor could be used by the height-actuator to better control the spraying height of the spray-module. Further information on height actuation, and on the use of spray-cooling enclosures, can be found in U.S. application Ser. No. 09/945,044, filed Aug. 31, 2001, which is incorporated herein by reference for all purposes.

In some cases, such as an automatic, electro-mechanical height-actuator that operates separately on each sprayer, the height-actuator could be programmable to adjust to each component's height, and is preferably configured to automatically adjust to the different component height of each inserted board. The information for configuring the height-actuator for different layouts could be carried in each board, thus making the system potentially a plug-and-play cooling system that immediately and automatically adjusts to component-heights of the inserted board.

Preferably, the sprayer delivery system is configured to more efficiently operate by using one or more sensors configured to sense information regarding the cooling-status of the components. This information could be component-specific (e.g., from having a sensor for each component), or general (e.g., by generally sensing the efficiency with which the spray-cooling system is operating). The controller is configured to control the delivery of cooling fluid by the sprayers to cool the components 103 based on the sensed information regarding the cooling status of the components.

The sensors can be temperature sensors, and might be incorporated within the components 103. They can be configured to detect individual temperatures of the different components, or they could be configured to monitor the overall temperature within the chamber.

Alternatively, the one or more sensors could be a pressure sensor 151 configured to sense pressure within the chamber, a power usage sensor configured to detect power usage by the various components, and/or a sensor configured to detect other indicia of cooling needs. Further information on sensor types and usage is contained in U.S. Pat. No. 6,595,014, issued Jul. 22, 2003, which is incorporated herein by reference for all purposes. As noted in the patent, combinations of sensor types can be used for accurate determinations of cooling-status.

Optionally, the sensors can be configured to sense the cooling needs of separate portions of one or more components. The sprayers can then spray differing amounts of cooling fluid on the separate component portions, as needed. The differing amounts can be sprayed from different sprayers of the spray-module while the spray-module in a single position. Alternatively, when the designated spray-location is a continuum of positions over the component, the differing amounts can be sprayed from the sprayers at different times as the spray-module moves through the continuum of positions. More information on this localized control of sprayers can be found in U.S. Pat. No. 6,484,521, issued Nov. 26, 2002, which is incorporated herein by reference for all purposes.

The controller automates the system delivery of cooling fluid to cool one or more hot components on a board by directing the automated steps of: actuating a spray-module including a sprayer to a first position from a second, laterally located position relative to the board, the first position being a designated spray-location relative to a first component of the one or more hot components; and spraying cooling fluid from the sprayer to cool the first component when the spray-module is positioned in the first position.

This process could be part of an ongoing repetition that further includes the steps of: actuating the spray-module to the second position from the first position, the second position being a designated spray-location relative to a second component of the one or more hot components; and spraying cooling fluid from the sprayer to cool the second component when the spray-module is positioned in the second position. Additional components may also be cooled by the spray-module. To do so, the spray-module is actuated to the additional components' designated spray-locations, and the sprayers sprayed onto the additional components, during actuation between the first and second positions. Under the direction of the controller, these steps are repeated for a continuous cycle of cooling.

The process could also include the steps of sensing information regarding the cooling status of one or more components; and controllably spraying cooling fluid from the sprayer to cool the one or more components, based on the sensed information regarding the cooling status of the one or more components. It should be noted that the various steps of sensing and actuating can be done in a variety of orders, and new sensory readings need not occur during each cycle of spraying the components.

In preparation for the above-recited processes, such as upon the insertion of a printed circuit board or the starting up the components of the printed circuit board, the controller could direct the step of reading configuration information, such as from the board, the configuration information identifying one or more designated spray-locations; and using this information to adapt for moving the spray-module among the designated spray-locations. The configuration information could also include information on whether the board has one or more temperature sensors that can be used in controlling the process of cooling. The step of adapting could be embodied by directing one of the actuators to go to a specific position, and/or it could be embodied in storing the appropriate information in registers or memory locations that are used in an ongoing basis in directing the actuators.

The enclosure 105 is preferably configured as a six-sided box with an opening 161 on one side. The opening is large enough for the printed circuit board 101 to pass through unobstructed. The enclosure is preferably mounted in a case of the electronic device such that the enclosure's opening can be opened and the board removed without any disassembly of the rest of the electronic device (or only insubstantial access-related activities such as opening the access door 113). Preferably, there is a plurality of such modules in the electronic device, each preferably being similarly mounted as readily accessible.

Preferably, the enclosure includes guides 163 that will guide the printed circuit board into the chamber to mate with the electrical connector. The board is preferably a unitary structure, and is preferably insertable and removable by hand. Alternatively, either a mechanical cam with an actuation lever can be used to dislodge the board, or a motorized device can dislodge and/or disgorge the board.

In some variations of the invention, it will be preferable to have a mechanism to provide for clearance between the sprayers and the chips when the board is guided into position. The mechanism can employ a guided board-insertion motion that is not coplanar with the board, such as an angled insertion pathway followed by a swinging motion to bring the board proximate the sprayers.

Alternatively, the mechanism can cause the sprayers to retract from the pathway of the board and its chips during their insertion and removal. The retraction mechanism could be manually activated by a technician, or it could be automatically activated upon the occurrence of an event such as the shutting down of the board or the opening of the enclosure. It could be mechanical or electro-mechanical. Furthermore, the mechanism could operate on the entire set of sprayers as a whole, or it could include individual retractors that each operates on a sprayer or group of sprayers. Preferably, the mechanism would operate using the height-actuators 141.

The sprayer delivery system preferably includes an external condenser (not shown), an external pump (not shown) and an external reservoir (not shown). The condenser, pump and reservoir are preferably configured to condense, cool and store the cooling fluid from a plurality of the electronic device's modules. The cooling fluid passes between the module and the condenser and pump via the inlet port 115 and the outlet port 117. Alternatively, the condenser and pump could be built into the module and directly or indirectly affixed to the enclosure. Depending on the orientation with respect to gravity, and on constraints of the electronic and fluid delivery systems, the inlet and/or outlet ports might be preferably located in other locations than shown in the figure, such as at the bottom of the enclosure.

In particular, the spray-modules each preferably receive cooling fluid from the reservoir via flexible tubing (such as TYGON® tubing from Norton Performance Plastics—Norton Company, or the like). Alternatively, the spray-module could include a reservoir configured to hold cooling fluid for delivery. To refill the reservoir, the actuator is then configured such that its plurality of lateral locations includes a station-location adjacent to a spray-module station (not shown). The station-location can also be a location among those accessible via the actuator, other than one of the lateral locations, that is adjacent to the station (e.g., at a location that's height precludes it from being among the plurality of lateral locations). The spray-module and spray-module station are configured for the spray-module station to provide cooling fluid to the reservoir of the spray-module when the spray-module is in the station-location. The controller is configured to control the spray-module actuator such that the spray-module actuator repeatedly actuates the spray-module between the station-location and one or more designated spray-locations.

In addition to, or alternatively to the spray-module station's spray-module refilling function, the spray-module station could function to interchange spray-modules. More particularly, the spray-module station could include a spray-module magazine that stores one or more replacement spray-modules. The actuator is preferably configured to insert spray-modules into the magazine and remove spray-modules from the magazine. The actuator includes a connection device configured to release a spray-module that's been inserted in the magazine, and configured to connect to a spray-module to be removed from the magazine.

Replacement spray modules can be identical to the original spray-module, and/or they can be of other sizes and shapes, and have different spray-cooling capacities. Thus, replacement spray-modules of different types can be used to cool different size and/or temperature components. The replacement spray-modules of the same type can be used to replace a malfunctioning spray-module, extending the time period between maintenance intervals. Also, spray-modules, preferably of the same type, can be used alternately to allow the one not being used to refill, rest and/or cool down. Thus, this feature provides both added versatility and improved reliability.

Figure 5:
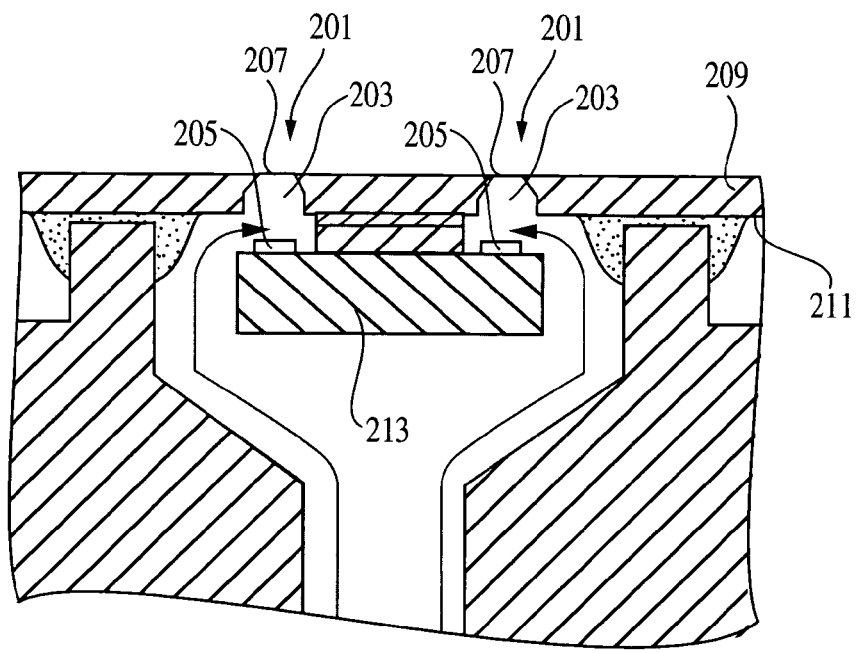
FIG. 5 is a cross-sectional view of two ink-jet type nozzles as used in the first modular connection system depicted in FIG. 2.

Preferably, each of the sprayers has a plurality of nozzles that conduct incremental spraying. More preferably, the sprayers are of the thermal ink-jet type. In particular, with reference to FIG. 5, which depicts two simplified, exemplary incremental ink-jet type nozzles 201, each nozzle includes structure defining a chamber 203 for receiving a predetermined portion of cooling fluid and a heater 205 for vaporizing a portion of the cooling fluid, to create the pressure to eject an incremental amount of the cooling fluid through an orifice 207 that directs the ejected cooling fluid toward the hot component 103 (FIGS. 3 and 4). The orifices are preferably formed in a flexible polymer tape 209, e.g., a polyimide tape such as is sold under the mark KAPTON.®

Affixed to a back surface 211 of the tape 209 is a silicon substrate 213 containing the heaters 205, in the form of individually energizable thin-film resistors. Each heater is preferably located on a side of the chamber 203 across from the chamber's orifice 207. Cooling fluid is preferably drawn and loaded into the chamber by capillary action, as is typical for an ink-jet type device. A computerized controller (not shown) energizes the heater, vaporizing the portion of the cooling fluid adjacent to the heater. The vaporized cooling fluid expands, expelling most of the non-vaporized cooling fluid out of the orifice, typically as a single droplet. More information on preferred types of sprayers can be found in U.S. Pat. No. 6,349,554, issued Feb. 26, 2002, which is incorporated herein by reference for all purposes.

Depending on the configuration of the sprayer, the incremental amount of the fluid sprayed from the sprayer could be in the form of a single droplet, or in the form of multiple droplets. Multiple droplets could be produced by multiple orifices related to a single heater, or by sprayers having larger chamber volumes and appropriately shaped orifice nozzles to cause the incremental amount of fluid to break into droplets. After the chamber has been fired by the heater, capillary action again loads the chamber for a subsequent firing.

The liquid spray from the incremental sprayers can be highly controllable. For example, by increasing or decreasing the frequency that the sprayers are energized, the flow rate can be accurately adjusted. Furthermore, because the sprayers can be configured to deliver very small quantities of cooling fluid, and because many sprayers can be fit into a small area, the heat distribution over that area can be accurately controlled by energizing some sprayers at a rate greater than that of other sprayers.

Combining the spray-module sprayers' adjustable height with their ability to control flow rates, the fluid delivery can be varied to suit the heat dissipated by a particular component, which enables the maximization of thermal efficiency in the delivery of cooling fluid to cool each hot component.

Preferably, the nozzle array and components are oriented to minimize the interaction between the vapor rising off the component and the drop. More particularly, preferably the vapor will rise in a direction canted to, or substantially perpendicular to, the spray direction so as to minimize its effect (particularly in reducing velocity) on the sprayed drops. To this end, the nozzle arrays can be positioned and/or configured to spray droplets that travel in a direction that is not downward with respect to gravity, so that the vapor will not rise toward the nozzle arrays in a direction parallel to the spray (see, e.g., FIGS. 2 and 3 where the sprayers spray laterally with respect to gravity). This feature is applicable for a wide variety of sprayer systems, both modular and otherwise.

This feature can be accomplished in a number of ways. One preferred way when using a perpendicular sprayer (i.e., one that sprays perpendicular to the surface of its nozzle array), is to cant the angle of the sprayer surface with respect to the sprayed surface, and locating the nozzle array at least partly offset from the component's sprayed surface. When the sprayed surface is horizontal with respect to gravity, this allows vapor to rise in a direction normal to the sprayed surface, while not impinging back onto (or only impinging on part of) the sprayer. In a somewhat similar alternative to this system, the sprayer's surface can be parallel to and offset from the sprayed surface, while using nozzles that spray toward the sprayed surface at an angle canted to the sprayed surface.

The spray-modules preferably can be easily replaced should they become damaged by having quick disconnects that connect the actuator and cooling fluid supply tubing to the spray-module, e.g., the types used in ink-jet printers and plotters.

The enclosure 105 (see FIGS. 2 and 3) is preferably configured to form a cooling-fluid retention basin 173 (i.e., a tray) that extends below the lowest point of the opening. The tray is configured to hold and retain all cooling fluid within the chamber 111 (with respect to gravity) when the board is being inserted or extracted, or the system is otherwise not in use. To prepare the board for use, the system preferably includes vacuum system (not shown) that partially or entirely evacuates the chamber after the door is sealed over the orifice.

To change a malfunctioning (or soon to be malfunctioning) printed circuit board, or to upgrade a printed circuit board, the board and its cooling system are deactivated. This preferably can occur with or without deactivating the remainder of the computer system. The door is then opened or removed, with the vacuum seal (if one exists) being broken either before or when the door is opened. The printed circuit board is then removed, preferably by simply pulling on the board to disengage the connectors. Alternatively, either a mechanical cam with an actuation lever can be used to dislodge the board, or a motorized device can dislodge and/or disgorge the board. A new board is then inserted and preferably pushed into place to engage the electrical connector. The guides 163 help guide the replacement printed circuit board into the module along the appropriate pathway, and to the correct location. The door is closed or attached, and the vacuum is reestablished if the cooling is to occur in a vacuum. The printed circuit board is then reactivated, and the cooling system is activated either prior to or concurrently with (or at least by the time it is needed after) the printed circuit board activation.

Figure 6:
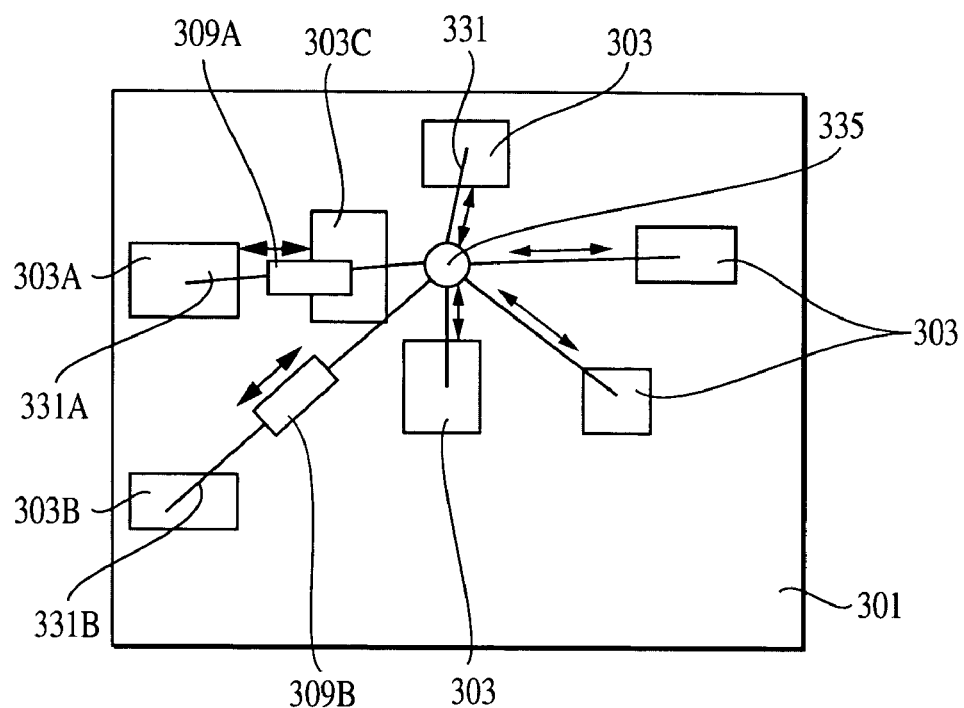
FIG. 6 is a side view of a sprayer delivery system and spray-modules spraying a printed circuit board, the sprayer delivery system and spray-modules being part of a second modular board connection system embodying the invention.

With reference to FIG. 6, a second preferred embodiment of the invention also resides in a sprayer delivery system, a related board connection system, a related spray-cooling system, and in related methods. Without repeating the extensive description above, this embodiment should be understood to incorporate the many features, advantages and uses described for the first embodiment, unless otherwise indicated below.

The board connection system is designed to removably contain a printed circuit board 301 carrying one or more hot (and typically heat-producing) components 303 such as semiconductor chips, including a hot first component 303A, and preferably a hot second component 303B and a hot third component 303C. The board connection system also includes an enclosure, as previously described, and includes one or more spray-modules including a first spray-module 309A and a second spray-module 309B. The spray-module sprayers are preferably configured to spray one or more of the components 303 with cooling fluid while the components are hot, such as during the components' operation. More particularly, the sprayer delivery system is configured for operating each spray-module in lateral locations that preferably include one or more designated spray-locations relative to the hot components on the board.

The sprayer delivery system includes plurality of actuators 331, including a first actuator 331A and a second actuator 331B. Each actuator is configured to actuate through a plurality of actuator positions. Each actuator's plurality of actuator positions relatively positions (with respect to the board) the spray-module 309, with one degree-of-freedom, at a respective plurality of lateral locations. Each plurality of lateral locations can be a continuum of lateral locations, a plurality of discrete locations, or combinations of the two.

More particularly, the first actuator 33 1A is structurally configured for one-degree-of-freedom actuation, i.e., it is configured to actuate the first spray-module 309A along a one-degree-of-freedom pathway and position it among a first plurality of lateral locations. Likewise, the second actuator 331B is structurally configured for one-degree-of-freedom actuation, i.e., it is configured to actuate the second spray-module 309B along a one-degree-of-freedom pathway and position it among a second plurality of lateral locations. This monotonic advancement, along a single, one-degree-of-freedom pathway, can be provided with a single actuation motor (not shown) that actuates the spray-module along some form of an actuation track. Thus, the actuators are structurally configured to move the spray-modules among the lateral locations through movement in one degree-of-freedom.

Included among the first plurality of lateral locations is the first designated spray-location, which is for the first component 303A. Likewise, included among the second plurality of lateral locations is a second designated spray-location, which is for the second component 303B. Thus, the sprayer of the first spray-module is configured for delivering cooling fluid to cool the first component when the first spray-module is positioned in the first designated spray-location, and the sprayer of the second spray-module is configured for delivering cooling fluid to cool the second component when the second spray-module is positioned in the second designated spray-location.

Given a printed circuit board with appropriately located components, each plurality of lateral locations can further include one or more additional designated spray-locations for spraying additional components. For example, for the depicted printed circuit board, the first plurality of lateral locations further includes a third designated spray-location for spraying the third component 303C. More generally speaking, the actuator is preferably configured to be usable with a plurality of different printed circuit boards, each potentially having different numbers and locations of components along the one-degree-of-freedom groups of lateral locations.

Each of the actuators is configured such that its plurality of lateral locations lies along a line, e.g., the first plurality of lateral locations lies along a first actuator line, and the second plurality of lateral locations lies along a second actuator line. The first and second lines intersect at a spray-module hub 335, which preferably serves as a support for the actuators. This arrangement provides for radial, linear zones of spray-cooling coverage on the printed circuit board. Preferably, the actuators thus provide for flexibly configured spray cooling that can adapt to the component configuration on a large variety of different boards that might be inserted into the chamber.

As described in the first embodiment, a controller is used to control the delivery of cooling fluid to cool each component 303 by its appropriate spray-module sprayer (i.e., by the sprayer on the spray-module that can be positioned in the designated spray-location of that component). The controller can comprise hardware and/or software, and can be provided in the components on the printed circuit board 301, in components that are part of the spray-module 309 or the sprayer delivery system, or in components external to the sprayer delivery system and circuit board.

The controller may be configured to control the delivery of cooling fluid to cool each component 303 by controlling the operation of the appropriate spray-module sprayer such that it sprays when its spray-module is located in the designated spray-location for the component. Alternatively, or concurrently, the controller may be configured to control the delivery of cooling fluid to cool each component by controlling the operation of each actuator 331 to direct the timing of one of the spray-modules 309 at the appropriate designated spray-location (e.g., direct the time and/or the length of time in which the first actuator places the first spray-module at the first component designated spray-location). In a very simplistic variation of this embodiment, the controller could be configured to simply activate the actuator for oscillating motion and spraying when a certain criterion is met, such as the printed circuit board components are present and energized.

The controller preferably controls the operation of each actuator 331, directing it to move among the lateral locations that serve as designated spray-locations for a given printed circuit board. As previously described: the controller preferably includes a configuration system configured to adapt the sprayer delivery system for different pluralities of lateral locations, and thus for use with different designated spray-locations on different types of boards; the sprayer delivery system preferably includes a height-actuator for each spray-module 309, being configured to control the spraying height of the spray-module sprayer above all components 303 for which the spray-module is appropriately used; the sprayer delivery system is preferably configured to more efficiently operate by using one or more sensors configured to sense information regarding the cooling status of the components; and each of the sprayers has a plurality of thermal ink-jet type nozzles that conduct incremental spraying. Optionally, the configuration system can have either manually or automatically adjustable actuators that change position based on board configuration.

The spray-modules preferably include a reservoir configured to hold cooling fluid for delivery. To refill the reservoir, the hub preferably operates as a spray-module station (as described above with respect to the first embodiment). More particularly, each actuator is configured such that its plurality of lateral locations includes a hub-location adjacent to the hub 335. Alternatively, the hub-location can be a location, adjacent to the hub, other than one of the lateral locations (e.g., at a location that's height precludes it from being among the plurality of lateral locations). The spray-modules and hub are configured for the hub to provide cooling fluid to the reservoir of each spray-module when the spray-module is in the hub-location. The controller is configured to control each spray-module actuator such that the spray-module actuator repeatedly actuates the spray-module between the hub-location and one or more designated spray-locations. Alternatively, the spray-modules each could receive cooling fluid via flexible tubing, as described above with respect to the first embodiment. In addition to, or alternatively to the hub's spray-module refilling function, the hub could function to interchange spray-modules, as described above with regard to the first embodiment.

Figure 7:
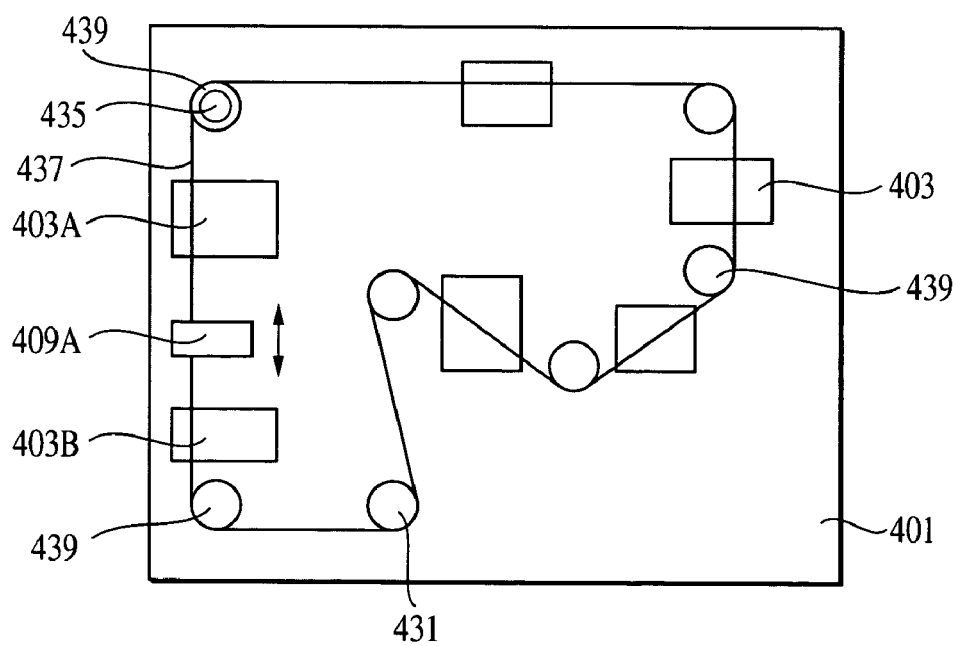
FIG. 7 is a side view of a sprayer delivery system and a spray-module spraying a printed circuit board, the sprayer delivery system and spray-module being part of a third modular board connection system embodying the invention.

With reference to FIG. 7, a third preferred embodiment of the invention also resides in a sprayer delivery system, a related board connection system, a related spray-cooling system, and in related methods. Without repeating the extensive description above, this embodiment should be understood to incorporate the many features, advantages and uses described for the first and second embodiments, unless otherwise indicated below.

The board connection system is designed to removably contain a printed circuit board 401 carrying one or more hot (and typically heat-producing) components 403 such as semiconductor chips, including a hot first component 403A, and preferably a hot second component 403B. The board connection system also includes an enclosure, as previously described, and includes one or more spray-modules including a first spray-module 409A. The spray-module sprayers are preferably configured to spray one or more of the components 403 with cooling fluid while the components are hot, such as during the components' operation. More particularly, the sprayer delivery system is configured for operating each spray-module in lateral locations that preferably include one or more designated spray-locations relative to the hot components on the board.

The sprayer delivery system includes an actuator 431 configured to actuate through a plurality of actuator positions. The actuator's plurality of actuator positions relatively positions (with respect to the board) the spray-module 409, with one degree-of-freedom, at a respective plurality of lateral locations. The plurality of lateral locations can be a continuum of lateral locations, a plurality of discrete locations, or combinations of the two.

More particularly, the actuator 431 is structurally configured for one-degree-of-freedom actuation, i.e., it is configured to actuate the spray-module 409 along a one-degree-of-freedom pathway and position it among a plurality of lateral locations. The structure, which provides monotonic advancement along a single, one-degree-of-freedom pathway, is preferably a single actuation motor 435 that actuates a ribbon 437 carrying the spray-module, the ribbon being strung on a plurality of pulleys 439. Preferably, the ribbon forms a continuous loop.

Alternatively, the spray-module actuator can actuate the spray-module along a fixed pathway, such as a nonlinear, continuous loop. A wide variety of actuator structures are envisioned as within the scope of the invention.

Optionally, additional spray-modules can also be carried on the ribbon, each spray-module being carried at different stations along the length of the ribbon. Preferably, the additional spray-modules' stations on the ribbon, relative to the first spray-module, are constant. Also preferably, all such spray-modules can move to the designated spray-location for each hot component. Thus, the actuator is structurally configured to move the spray-module (or spray-modules) among the lateral locations through movement in one degree-of-freedom.

Included among the first plurality of lateral locations is the first designated spray-location, which is for the first component 403A. Likewise, included among the second plurality of lateral locations is a second designated spray-location, which is for the second component 403B. Thus, the spray-module sprayer is configured for delivering cooling fluid to cool the first component when the spray-module is positioned in the first designated spray-location, and the spray-module sprayer is configured for delivering cooling fluid to cool the second component when the spray-module is positioned in the second designated spray-location. More generally speaking, the actuator is preferably configured to be usable with a plurality of different printed circuit boards, each potentially having different numbers and locations of components along the one-degree-of-freedom group of lateral locations.

The actuator 431 is configured such that its plurality of lateral locations lies along a single, nonlinear, and preferably continuous pathway. The pathway can have a number of parallel segments, mimicking the operation of the first embodiment, a number of radial segments, mimicking the operation of the second embodiment, or segments forming a different layout (as depicted), such as might be optimal for a particular printed circuit board. Preferably, the actuator thus provides for flexibly configured spray cooling that can adapt to the component configuration on a large variety of different boards that might be inserted into the chamber.

As described in the first embodiment, a controller is used to control the delivery of cooling fluid to cool each component 403 by spray-module sprayers. The controller can comprise hardware and/or software, and can be provided in the components on the printed circuit board 401, in components that are part of the spray-modules 409 or the sprayer delivery system, or in components external to the sprayer delivery system and circuit board.

The controller may be configured to control the delivery of cooling fluid to cool each component 403 by controlling the operation of an appropriate spray-module sprayer such that it sprays when its spray-module is located in the designated spray-location for the component. Alternatively, or concurrently, the controller may be configured to control the delivery of cooling fluid to cool each component by controlling the operation of the actuator 431 to direct the timing of one of the spray-modules 409 at the appropriate designated spray-location (e.g., direct the time and/or the length of time in which the first actuator places the first spray-module at the first component designated spray-location). In a very simplistic variation of this embodiment, the controller could be configured to simply activate the actuator for oscillating motion and spraying when a certain criterion is met, such as the printed circuit board components are present and energized.

The controller preferably controls the operation of the actuator 431, directing it to move spray-modules among the lateral locations that serve as designated spray-locations for a given printed circuit board. As previously described: the sprayer delivery system preferably includes a height-actuator for each spray-module 409, being configured to control the spraying height of the spray-module sprayer above all components 403 for which the spray-module is appropriately used; the sprayer delivery system is preferably configured to more efficiently operate by using one or more sensors configured to sense information regarding the cooling status of the components; and each of the sprayers has a plurality of thermal ink-jet type nozzles that conduct incremental spraying.

The controller preferably includes a configuration system configured to adapt the sprayer delivery system for different pluralities of lateral locations, and thus for use with different designated spray-locations on different types of boards. As previously described, this configuration system preferably has a location-designator portion that identifies layout information for a given printed circuit board, the layout information preferably including both the location and the cooling requirements of the components. As discussed before, this information might be red or derived from data stored by components 403 on the printed circuit board 401, or it may come from another source such as user input.

Using the layout information obtained by the configuration system, the controller can direct the actuator 431 according the components' cooling needs. The component-location information is used to establish spray-module actuator controls. More particularly, for spray-modules having only one designated spray-location among its plurality of lateral locations, the controller can direct the actuator to move that spray-module to the designated location. For spray-modules having two or more designated spray-location among its plurality of lateral locations, the controller can direct the actuator to move among the designated locations. Additionally, or alternatively, the configuration system preferably includes a support-actuator configured to move the actuator supports (i.e., the pulleys) and adapt them for use with a different plurality of lateral locations.

The spray-modules preferably include a reservoir configured to hold cooling fluid for delivery. To refill the reservoir, the actuator is configured such that its plurality of lateral locations includes a station-location adjacent to a spray-module station (not shown) as described above with respect to the first embodiment. The spray-module and spray-module station are configured for the spray-module station to provide cooling fluid to the reservoir of the spray-module when the spray-module is in the station-location. The controller is configured to control the spray-module actuator such that the spray-module actuator repeatedly actuates the spray-module between the station-location and one or more designated spray-locations. In addition to, or alternatively to the spray-module station's spray-module refilling function, the spray-module station could function to interchange spray-modules, as described above with regard to the first embodiment.

Alternatively, the spray-modules each could receive cooling fluid via flexible tubing, as described above with respect to the first embodiment. If flexible tubing is used, either the tubing will require an attachment fixture that prevents the tubing from becoming tangled or twisted, or the controller will require system rules that limit the total travel of the spray-module(s) to prevent the tubing from becoming tangled or twisted.

Figure 8:
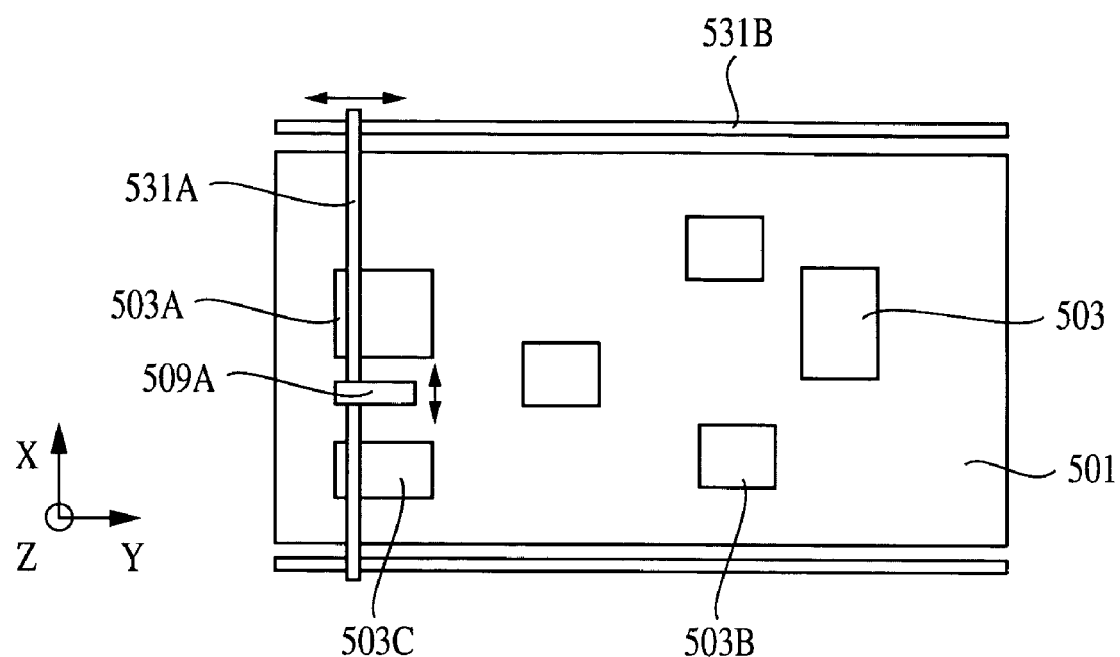
FIG. 8 is a side view of a sprayer delivery system and a spray-module spraying a printed circuit board, the sprayer delivery system and spray-module being part of a fourth modular board connection system embodying the invention.

With reference to FIG. 8, a fourth preferred embodiment of the invention also resides in a sprayer delivery system, a related board connection system, a related spray-cooling system, and in related methods. Without repeating the extensive description above, this embodiment should be understood to incorporate the many features, advantages and uses described for the first, second and third embodiments, unless otherwise indicated below.

The board connection system is designed to removably contain a printed circuit board 501 carrying one or more hot (and typically heat-producing) components 503 such as semiconductor chips, including a hot first component 503A, and preferably a hot second component 503B. The board connection system also includes an enclosure, as previously described, and includes one or more spray-modules including a first spray-module 509A. The spray-module sprayers are preferably configured to spray one or more of the components 503 with cooling fluid while the components are hot, such as during the components' operation. More particularly, the sprayer delivery system is configured for operating each spray-module in lateral locations that preferably include one or more designated spray-locations relative to the hot components on the board.

The sprayer delivery system includes an actuator having a plurality of actuator-portions, including a first actuator-portion 531A and a second actuator-portion 531B. The first actuator-portion is configured to carry the first spray-module 509A, and laterally position it through a series of first-actuator-portion positions providing one-degree-of-freedom motion. The second actuator-portion is configured to laterally position the first spray-module 509A through a series of second-actuator-portion positions providing a second, independent one-degree-of-freedom motion. The second actuator-portion is preferably configured to do so by carrying the first actuator-portion, or a relevant portion thereof.

The combined actuation of the first- and second-actuator-portion provides two-degree-of-freedom actuation, i.e., the combined actuation relatively positions (with respect to the board) the spray-module 509, with two degrees-of-freedom, at a plurality of lateral locations. Any of these lateral locations could typically be reached via more than one pathway (i.e., through more than one combination of one-degree-of-freedom movements). The actuator might, for example, be similar to mechanisms used in X-Y plotters. As a result, the actuator is structurally configured for two-degree-of-freedom actuation among a plurality of lateral locations. The plurality of lateral locations can be a continuum of lateral locations, a plurality of discrete locations, or combinations of the two.

More particularly, the first actuator-portion 531A is structurally configured for one-degree-of-freedom actuation, i.e., it is configured to actuate the first spray-module 509A laterally with one degree-of-freedom of movement, and the second actuator-portion 531B is structurally configured for one-degree-of-freedom actuation, i.e., it is configured to actuate the first spray-module 509A laterally with one-degree-of-freedom of movement. Because the two, lateral degrees-of-freedom are independent, the actuation magnitude of both actuator-portions is required to determine the spray-module position. This configuration provides flexibility in the course that a spray-module can travel between any two lateral locations.

Included among the plurality of lateral locations is a first designated spray-location, which is for the first component 503A. Likewise, included among the plurality of lateral locations is a second designated spray-location, which is for the second component 503B. Thus, the sprayer of the first spray-module is configured for delivering cooling fluid to cool the first component when the first spray-module is positioned in the first designated spray-location, and for delivering cooling fluid to cool the second component when the first spray-module is positioned in the second designated spray-location.

Given a printed circuit board with appropriately located components, the plurality of lateral locations can further include one or more additional designated spray-locations for spraying additional components. For example, for the depicted printed circuit board, the first plurality of lateral locations further includes a third designated spray-location for spraying the third component 503C. Movement of the spray-module among the designated spray-locations might require actuation of just one actuator-portion (such as movement between the first and third components, 503A and 503C), or it might require actuation of both actuator-portions (such as movement between the first and second components, 503A and 503B). More generally speaking, the actuator is preferably configured to be usable with a plurality of different printed circuit boards, each potentially having different numbers and locations of components.

Each of the actuator-portions is configured for linear movement, providing travel to a plurality of linear, lateral locations for any given actuation position of the other actuator-portion. Preferably, the actuators thus provide for flexibly configured spray cooling that can adapt to the component configuration on a large variety of different boards that might be inserted into the chamber.

Variations of this embodiment could provide two-degree-of-freedom actuation with nonlinear degrees-of-freedom. For example, a first, linear actuator-portion could be carried on and rotated by a second, rotational actuator-portion (e.g., a hub). This hub-like rotational actuator-portion would preferably be centrally located with respect to the board, rotating the first actuator-portion through 360 degrees of motion. Additionally, other combinations of actuator-portions could be used, such as two rotational actuators.

Variations of this embodiment could also include multiple spray-modules. These spray-modules could be mounted on the first actuator-portion, either statically or dynamically displaced from the first spray-module. Alternatively, these spray-modules could be mounted on a third actuator-portion that operates similarly to the first actuator-portion. The third and first actuator-portions would need to be controlled so as not to interfere with each other's operation.

As described in the first embodiment, a controller is used to control the delivery of cooling fluid to cool each component 503 by the spray-module sprayer. The controller can comprise hardware and/or software, and can be provided in the components on the printed circuit board 501, in components that are part of the spray-module 509A or the sprayer delivery system, or in components external to the sprayer delivery system and circuit board.

The controller may be configured to control the delivery of cooling fluid to cool each component 503 by controlling the operation of the appropriate spray-module sprayer such that it sprays when its spray-module is located in the designated spray-location for the component. Alternatively, or concurrently, the controller may be configured to control the delivery of cooling fluid to cool each component by controlling the operation of each actuator-portion to direct the timing of one of the spray-modules at the appropriate designated spray-location (e.g., direct the time and/or the length of time in which the first actuator places the first spray-module at the first component designated spray-location). In a very simplistic variation of this embodiment, the controller could be configured to simply activate the actuator for oscillating two-degree-of-freedom motion and spraying when a certain criterion is met, such as the printed circuit board components are present and energized.

The controller preferably controls the operation of each actuator-portion, directing the actuator to move among the lateral locations that serve as designated spray-locations for a given printed circuit board. As previously described: the controller preferably includes a configuration system configured to adapt the sprayer delivery system for different pluralities of lateral locations, and thus for use with different designated spray-locations on different types of boards; the sprayer delivery system preferably includes a height-actuator for each spray-module, being configured to control the spraying height of the spray-module sprayer above all components 503 for which the spray-module is appropriately used; the sprayer delivery system is preferably configured to more efficiently operate by using one or more sensors configured to sense information regarding the cooling status of the components; and each of the sprayers has a plurality of thermal ink-jet type nozzles that conduct incremental spraying. Optionally, the configuration system can have either manually or automatically adjustable actuators that change position based on board configuration.

The spray-modules each preferably receive cooling fluid from the reservoir via flexible tubing. Alternatively, the spray-module could include a reservoir configured to hold cooling fluid for delivery. To refill the reservoir, the actuator is then configured such that its plurality of lateral locations includes a station-location adjacent to a spray-module station (not shown). The spray-module and spray-module station are configured for the spray-module station to provide cooling fluid to the reservoir of the spray-module when the spray-module is in the station-location. The controller is configured to control the spray-module actuator such that the spray-module actuator repeatedly actuates the spray-module between the station-location and one or more designated spray-locations. In addition to, or alternatively to the spray-module station's spray-module refilling function, the spray-module station could function to interchange spray-modules, as described above with regard to the first embodiment.

Various forms of the invention are usable in a wide range of applications. For example, in addition to use in normal processing systems, the present invention might be used for semiconductor testing i.e. the functional testing of semiconductor wafers at speed.

While particular forms of the invention have been illustrated and described, it will be apparent that various modifications can be made without departing from the spirit and scope of the invention. For example, while the hot components were described as semiconductor chips, cooling systems for other related devices, such as optical/laser devices, and other operational components that are potential subjects of spray cooling, are also within the scope of the invention. Likewise, while incremental, thermal ink-jet sprayers were described, other sprayer types, including piezoelectric sprayers and pressure- or gas-driven atomizers are within the scope of the invention. Furthermore, while the embodiments are all described for use with a unitary printed circuit board, the scope of the invention includes a board composed of a plurality of coplanar printed circuit boards (or other board types), as well as structure that holds various components in a relatively coplanar relationship (i.e., differing by an amount no greater than would be a reasonable, functional height variation for spray cooling).

Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

We claim:

1. A delivery system for delivering cooling fluid to cool a hot component on a board, the component having a designated spray-location, comprising:

a spray-module including a sprayer configured to cool the component by spraying cooling fluid when the spray-module is located in the designated spray-location; and an actuator configured to actuate through a plurality of actuator positions that relatively position the spray-module at a plurality of lateral locations with respect to the board, one of the plurality of lateral locations being the designated spray-location.

2. A delivery system for delivering cooling fluid to cool a hot component on a board, the component having a designated spray-location, comprising:

a spray-module including a sprayer configured for delivering cooling fluid to cool the component when the spray-module is located in the designated spray-location; and an actuator configured to actuate through a plurality of actuator positions that relatively position the spray-module at a plurality of lateral locations with respect to the board, one of the plurality of lateral locations being the designated spray-location;

wherein the actuator is structurally configured for one-degree-of-freedom actuation among the plurality of actuator positions, and wherein the plurality of actuator positions independently determines the lateral locations to which the spray-module can be actuated.

3. The delivery system of claim 2, being further configured for delivering cooling fluid to cool a second hot component on the board, the second component having a second designated spray-location, and further comprising:

a second spray-module including a second sprayer configured for delivering cooling fluid to cool the second component when the second spray-module is located in the second designated spray-location; and a second actuator configured to actuate through a second plurality of actuator positions that relatively position the second spray-module at a second plurality of lateral locations with respect to the board, one of the second plurality of lateral locations being the second designated spray-location;

wherein the second actuator is configured for one-degree-of-freedom actuation among the second plurality of actuator positions; and wherein the second plurality of actuator positions independently determines the lateral locations to which the second spray-module can be actuated.

4. The delivery system of claim 3, wherein the board is a unitary board.

5. The delivery system of claim 3, wherein the first and second actuators are configured such that the first plurality of lateral locations lies along a first line, the second plurality of lateral locations lies along a second line, and the first and second lines are parallel.

6. The delivery system of claim 3, and further including a spray-module hub, wherein the first and second actuators are configured such that the first plurality of lateral locations lies along a first line, the second plurality of lateral locations lies along a second line, and the first and second lines intersect at the hub.

7. The delivery system of claim 6, wherein:

each actuator is configured to relatively move its spray-module to a hub-location adjacent to the hub;

each spray-module includes a reservoir configured to hold cooling fluid for delivery; and the spray-modules and hub are configured for the hub to provide cooling fluid to the reservoir of each spray-module when that spray-module is in the hub-location of its actuator.

8. The delivery system of claim 2, wherein the actuator is configured such that the plurality of lateral locations lies along a single, nonlinear pathway.

9. The delivery system of claim 8, wherein the actuator includes a continuous loop of ribbon mounted on a plurality of supports, the spray-module being carried on the ribbon.

10. The delivery system of claim 9, and further comprising a second spray-module, wherein the second spray-module is carried on the ribbon at a different station along the ribbon.

11. The delivery system of claim 9, and further including a configuration system including a support-actuator configured to adapt the plurality of supports for use with a different plurality of lateral locations by moving one or more of the plurality of supports.

12. A delivery system for delivering cooling fluid to cool a hot component on a board, the component having a designated spray-location, comprising:

a spray-module including a sprayer configured for delivering cooling fluid to cool the component when the spray-module is located in the designated spray-location; and an actuator configured to actuate through a plurality of actuator positions that relatively position the spray-module at a plurality of lateral locations with respect to the board, one of the plurality of lateral locations being the designated spray-location;

wherein the actuator is structurally configured for two-degree-of-freedom actuation among the plurality of actuator positions.

13. The delivery system of claim 12, wherein:

the actuator includes a first actuator-portion configured to relatively position the spray-module laterally with a first degree-of-freedom; and the actuator includes a second actuator-portion configured to relatively position the spray-module laterally with a second degree-of-freedom.

14. A delivery system for delivering cooling fluid to cool a hot component on a board, the component having a designated spray-location, comprising:

a spray-module including a sprayer configured for delivering cooling fluid to cool the component when the spray-module is located in the designated spray-location;

an actuator configured to actuate through a plurality of actuator positions that relatively position the spray-module at a plurality of lateral locations with respect to the board, one of the plurality of lateral locations being the designated spray-location; and a spray-module station;

wherein the actuator is configured to relatively move the spray-module to a station-location adjacent to the spray-module station;

wherein the spray-module includes a reservoir configured to hold cooling fluid for delivery; and wherein the spray-module and spray-module station are configured for the spray-module station to provide cooling fluid to the reservoir of the spray-module when the spray-module is in the station-location.

15. A delivery system for delivering cooling fluid to cool a hot component on a board, the component having a designated spray-location, comprising:

a spray-module including a sprayer configured for delivering cooling fluid to cool the component when the spray-module is located in the designated spray-location;

an actuator configured to actuate through a plurality of actuator positions that relatively position the spray-module at a plurality of lateral locations with respect to the board, one of the plurality of lateral locations being the designated spray-location; and a spray-module station including a magazine configured to store one or more replacement spray-modules, wherein the actuator is configured to removably connect to a spray-module of the one or more replacement spray-modules.

16. A delivery system for delivering cooling fluid to cool a hot component on a board, the component having a designated spray-location, comprising:

a spray-module including a sprayer configured for delivering cooling fluid to cool the component when the spray-module is located in the designated spray-location;

an actuator configured to actuate through a plurality of actuator positions that relatively position the spray-module at a plurality of lateral locations with respect to the board, one of the plurality of lateral locations being the designated spray-location; and a height-actuator configured to control the height of the sprayer above the component at the designated spray-location.

17. A delivery system for delivering cooling fluid to cool a hot component on a board, the component having a designated spray-location, comprising:

a means for spraying cooling fluid; and a means for relatively actuating the means for spraying among a plurality of lateral locations with respect to the board, one of the plurality of lateral locations being the designated spray-location;

wherein the means for spraying is configured to cool the component when located at the designated spray-location.

18. The delivery system of claim 17, wherein:

the means for actuating is structurally configured to relatively move the means for spraying in exactly one degree-of-freedom; and the one-degree-of-freedom movement by the means for actuating independently determines the lateral locations, with respect to the board, to which the spray-module can be actuated.

19. The delivery system of claim 17, wherein the means for actuating is structurally configured to relatively move the spray-module in two degrees-of-freedom.

20. A method for delivering cooling fluid to cool a hot component on a board, the component having a designated spray-location, comprising the automated steps of:

(a) relatively actuating a spray-module, among a plurality of lateral locations with respect to the board, to a first lateral location of the plurality of lateral locations, wherein the first lateral location is the designated spray-location for the component; and (b) spraying cooling fluid from the spray-module to cool the component when the spray-module is located at the designated spray-location of the component.

21. The method of claim 20, being further configured for delivering cooling fluid to cool a second hot component on the board, the second component having a second designated spray-location, and further comprising the automated steps of:

(c) relatively actuating a second spray-module, among a second plurality of lateral locations with respect to the board, to a second lateral location of the second plurality of lateral locations, wherein the second lateral location is the designated spray-location for the second component; and (d) spraying cooling fluid from the second spray-module to cool the second component when the second spray-module is located at the designated spray-location for the second component; and (e) repeating steps (a) through (d).

22. The method of claim 20, being further configured for delivering cooling fluid to cool a second hot component on the board, the second component having a second designated spray-location, and further comprising the automated steps of:

(c) relatively actuating the spray-module to a second lateral location of the plurality of lateral locations, wherein the second lateral location is the designated spray-location for the second component; and (d) spraying cooling fluid from the spray-module to cool the second component when the spray-module is located at the designated spray-location for the second component; and (e) repeating steps (a) through (d).

23. The method of claim 22, wherein the steps of actuating are conducted by an actuator structurally configured for one-degree-of-freedom actuation among all lateral locations to which the spray-module can be actuated.

24. The method of claim 23, wherein the actuator structure defines a single, nonlinear pathway forming a continuous loop along which the spray-module can be actuated.

25. The method of claim 22, wherein the steps of actuating are conducted by an actuator including structure configured for two-degree-of-freedom actuation among all lateral locations to which the spray-module can be actuated.

26. A sprayer delivery system for operating a spray-module at a plurality of laterally located designated spray-locations relative to a respective plurality of hot components, the spray-module including a sprayer configured for delivering cooling fluid to cool each component of the plurality of components when the spray-module is located in the respective designated spray-location for that component, comprising:

an actuator configured to relatively move the spray-module among the plurality of designated spray-locations; and a controller configured to control the delivery of cooling fluid by the sprayer, to cool the plurality of components.

27. The sprayer delivery system of claim 26, wherein the controller is configured to control the height of the sprayer relative to each component of the plurality of components.

28. The sprayer delivery system of claim 26, and further comprising a spray-module station, wherein:

the actuator is configured to relatively move the spray-module to a station-location adjacent the spray-module station;

the controller is configured to control the actuator such the actuator repeatedly actuates the spray-module to the station-location;

the spray-module includes a reservoir configured to hold cooling fluid for delivery; and the spray-module and spray-module station are configured for the spray-module station to provide cooling fluid to the reservoir when the spray-module is in the station-location.

29. The sprayer delivery system of claim 26, and further including a spray-module station including a magazine configured to store one or more replacement spray-modules, wherein:
the actuator is configured to removably connect to a spray-module of the one or more replacement spray-modules.

30. The sprayer delivery system of claim 26, wherein the controller is configured to control the delivery of cooling fluid by controlling the operation of the sprayer to cool each component.

31. The sprayer delivery system of claim 26, wherein the controller is configured to control the delivery of cooling fluid by controlling the operation of the actuator.

32. The sprayer delivery system of claim 26, and further comprising a configuration system configured to adapt at least one of the actuator and the controller, for use with different pluralities of designated spray-locations.

33. The sprayer delivery system of claim 32, wherein the configuration system includes a location-designator portion of the controller, the location-designator portion using component-location information about the board to establish actuator controls for positioning the spray-module at the designated spray-locations.

34. The sprayer delivery system of claim 32, wherein:
the plurality of components are part of one or more insertable structures; and
the configuration system is configured to access configuration information from the one or more insertable structures.

35. A board connection system for connecting to a board having a plurality of hot components that define a respective plurality of designated spray-locations for delivering cooling fluid to the hot components, and having a component configured to provide configuration information, comprising:
a spray-module including a sprayer configured for delivering cooling fluid;
an enclosure configured for the removable reception of the board; and
the sprayer delivery system of claim 34, configured for accessing the configuration information from the board when the board is received in the enclosure, for adapting the actuator for use with the plurality of designated spray-locations, and for operating the spray-module at the plurality of designated spray-locations.

36. A sprayer delivery system for operating a spray-module at a plurality of laterally located designated spray-locations relative to a respective plurality of hot components, the spray-module including a sprayer configured for delivering cooling fluid to cool each of the plurality of components when the spray-module is located in the respective designated spray-location for that component, comprising:
a means for relatively actuating the spray-module among the plurality of designated spray-locations; and
a means for controlling the delivery of cooling fluid by the sprayer, to cool the plurality of components.

37. The sprayer delivery system of claim 36, and further comprising a means for adapting the means for actuating such that the means for actuating is configured to relatively move the spray-module among the plurality of designated spray-locations.

38. The sprayer delivery system of claim 37, wherein the plurality of components are part of one or more insertable structures, and further comprising a means for reading configuration information from at least one of the insertable structures, the information identifying the plurality of designated spray-locations for use by the means for adapting.

39. The sprayer delivery system of claim 36, and further comprising a means for adapting the means for controlling such that the means for controlling is configured to operate the sprayer when the spray-module is located in the designated spray-locations.

40. A method for operating a spray-module at a plurality of laterally located designated spray-locations relative to a respective plurality of components, the spray-module including a sprayer configured for delivering cooling fluid to cool each of the plurality of components when the spray-module is located in the respective designated spray-location for that component, comprising:
relatively actuating the spray-module among the plurality of designated spray-locations; and
controlling the delivery of cooling fluid by the sprayer, to cool the plurality of components.

41. The method of claim 40, and prior to the steps of actuating and directing, further comprising:
adapting the actuation of the step of actuating such that the spray-module moves among the plurality of designated spray-locations.

42. The method of claim 41, wherein the plurality of components are part of one or more insertable structures, and wherein the step of adapting includes:
reading information from at least one of the insertable structures, the information identifying the plurality of designated spray-locations for use in the step of adapting.

43. A sprayer delivery system for operating a spray-module at a designated spray-location relative to a hot component on a board, the spray-module including a sprayer configured for delivering cooling fluid to cool the component when the spray-module is located in the designated spray-location, comprising:
a sensor configured to sense cooling-status information;
an actuator configured to relatively move the spray-module among a plurality of lateral locations with respect to the board, one of the plurality of lateral locations being the designated spray-location; and
a controller configured to control the delivery of cooling fluid by the sprayer to cool the component, based on the cooling-status information sensed by the sensor.

44. The sprayer delivery system of claim 43, being further configured for operating the spray-module at a second designated spray-location relative to a second hot component on the board, the second designated spray-location being one of the plurality of lateral locations, and further comprising:
a second sensor, configured to sense cooling-status information regarding the cooling status of the second component;
wherein the controller is configured to control the delivery of cooling fluid by the sprayer to cool the second component, based on the cooling-status information sensed by the second sensor.

45. The sprayer delivery system of claim 44, wherein the second sensor is configured to detect a temperature of the second component.

46. The sprayer delivery system of claim 44, wherein the second sensor is configured to detect a power usage level of the second component.

47. The sprayer delivery system of claim 43, wherein the sensor is configured to detect pressure.

48. A sprayer delivery system for operating a spray-module at a designated spray-location relative to a hot component on a board, the spray-module including a sprayer configured for delivering cooling fluid to cool the component when the spray-module is located in the designated spray-location, comprising:

a sensing means for sensing cooling-status information;

an actuating means for relatively actuating the spray-module among a plurality of lateral locations with respect to the board, one of the plurality of lateral locations being the designated spray-location; and a controlling means for controlling the delivery of cooling fluid by the sprayer to cool the component, based on the cooling-status information sensed by the sensing means.

49. The sprayer delivery system of claim 48, being further configured for operating the spray-module at a second designated spray-location relative to a second hot component on the board, the second designated spray-location being one of the plurality of lateral locations, and further comprising:

a second sensing means for sensing cooling-status information regarding the cooling status of the second component;

wherein the controlling means is configured for controlling the delivery of cooling fluid by the sprayer to cool the second component, based on the cooling-status information sensed by the second sensing means.

50. A method for operating a spray-module at a designated spray-location relative to a hot component on a board, the spray-module including a sprayer configured for delivering cooling fluid to cool the component when the spray-module is located in the designated spray-location, comprising:

(a) sensing cooling-status information;

(b) relatively actuating the spray-module among a plurality of lateral locations with respect to the board to reach the designated spray-location, wherein one of the plurality of lateral locations is the designated spray-location;

(c) controlling the delivery of cooling fluid by the sprayer to cool the component, based on the cooling-status information sensed in step (a); and (d) repeating steps (a), (b) and (c).

51. The method of claim 50, wherein step (a) occurs prior to step (b) in each repetition that includes steps (a) and (b).

52. The method of claim 50, further providing for operating the spray-module at a second designated spray-location relative to a second hot component on the board, the second designated spray-location being one of the plurality of lateral locations, and further comprising:

(e) sensing cooling-status information regarding the cooling status of the second component;

(f) relatively actuating the spray-module among the plurality of lateral locations with respect to the board to reach the second designated spray-location;

(g) controlling the delivery of cooling fluid by the sprayer to cool the second component, based on the cooling-status information sensed in step (e);

(h) repeating steps (e), (f) and (g).

53. The method of claim 52, wherein step (e) occurs prior to step (f) in each repetition that includes steps (e) and (f).

54. The delivery system of claim 1, wherein:

the actuator is structurally configured for one-degree-of-freedom actuation among the plurality of actuator positions, and the plurality of actuator positions independently determines the lateral locations to which the spray-module can be actuated.

55. The delivery system of claim 1, wherein the actuator is structurally configured for two-degree-of-freedom actuation among the plurality of actuator positions.

56. The delivery system of claim 1, and further including a spray-module station, wherein:

the actuator is configured to relatively move the spray-module to a station-location adjacent to the spray-module station;

the spray-module includes a reservoir configured to hold cooling fluid for delivery; and the spray-module and spray-module station are configured for the spray-module station to provide cooling fluid to the reservoir of the spray-module when the spray-module is in the station-location.

57. The delivery system of claim 1, and further including a spray-module station including a magazine configured to store one or more replacement spray-modules, wherein:

the actuator is configured to removably connect to a spray-module of the one or more replacement spray-modules.

58. The delivery system of claim 1, and further comprising a height-actuator configured to control the height of the sprayer above the component at the designated spray-location.

\* \* \* \* \*